United States Patent
Chang et al.

(10) Patent No.: US 12,046,553 B2
(45) Date of Patent: Jul. 23, 2024

(54) ELECTRONIC FUSE (eFuse) DESIGNS FOR ENHANCED CHIP SECURITY

(71) Applicant: Marvell Asia Pte Ltd, Singapore (SG)

(72) Inventors: Runzi Chang, Saratoga, CA (US); Chon In Kou, San Jose, CA (US); Minda Zhang, Westford, MA (US)

(73) Assignee: MARVELL ASIA PTE LTD, Singapore (SG)

(*) Notice: Subject to any disclaimer, the term of this patent is extended or adjusted under 35 U.S.C. 154(b) by 116 days.

(21) Appl. No.: 17/971,602

(22) Filed: Oct. 23, 2022

(65) Prior Publication Data
US 2023/0139634 A1 May 4, 2023

Related U.S. Application Data

(60) Provisional application No. 63/273,124, filed on Oct. 28, 2021.

(51) Int. Cl.
| | |
|---|---|
| *H01L 23/52* | (2006.01) |
| *G01R 31/74* | (2020.01) |
| *H01L 23/525* | (2006.01) |
| *H01L 27/02* | (2006.01) |

(52) U.S. Cl.
CPC ......... *H01L 23/5256* (2013.01); *G01R 31/74* (2020.01); *H01L 27/0248* (2013.01)

(58) Field of Classification Search
CPC . H01L 23/5256; H01L 27/0248; G01R 31/74; G01R 31/31719; G06F 30/398; G06F 2119/02
See application file for complete search history.

(56) References Cited

U.S. PATENT DOCUMENTS

| | | | |
|---|---|---|---|
| 7,224,633 B1 * | 5/2007 | Hovis | G11C 17/18 365/207 |
| 7,254,078 B1 | 8/2007 | Park et al. | |
| 8,050,129 B2 * | 11/2011 | Liu | G11C 17/18 365/96 |
| 8,234,543 B2 | 7/2012 | Henry et al. | |
| 2007/0241768 A1 * | 10/2007 | Erickson | G06F 21/71 326/8 |
| 2008/0158933 A1 * | 7/2008 | Allen | G11C 17/18 365/96 |
| 2009/0310266 A1 * | 12/2009 | Etherton | G11C 17/18 327/525 |

OTHER PUBLICATIONS

Gorman et al., U.S. Appl. No. 18/101,586, filed Jan. 26, 2023.

* cited by examiner

*Primary Examiner* — Alvaro E Fortich

(57) ABSTRACT

An Integrated Circuit (IC) includes electronic circuitry, an electronic fuse (eFuse) and a protection circuit. The eFuse is configured to be selectably programmed to a logical state. The electronic circuitry is configured to read the eFuse and to operate in accordance with the logical state read from the eFuse. The eFuse has a first range of operational voltages, and the electronic circuitry has a second range of operational voltages that is broader than the first range of operational voltages. The protection circuit is configured to prevent the electronic circuitry from misreading the logical state of the eFuse due to a voltage supply to the IC falling within the second operational voltage range but outside the first operational voltage range.

14 Claims, 2 Drawing Sheets

ELECTRONIC FUSE (eFuse) DESIGNS FOR ENHANCED CHIP SECURITY

CROSS-REFERENCE TO RELATED APPLICATIONS

This application claims the benefit of U.S. Provisional Patent Application 63/273,124, filed Oct. 28, 2021, whose disclosure is incorporated herein by reference.

FIELD OF THE DISCLOSURE

The present disclosure relates generally to Integrated Circuit (IC) design, and particularly to techniques for improving the reliability of electronic fuses (eFuses).

BACKGROUND

Electronic fuses (eFuses) are microscopic fuses that are embedded in Integrated Circuits (IC). An eFuse can be programmed to one of two logical states—open-circuit or short-circuit—which can be read by the IC circuitry. By programming a set of eFuses, an IC can be set to a desired configuration, e.g., after production.

The description above is presented as a general overview of related art in this field and should not be construed as an admission that any of the information it contains constitutes prior art against the present patent application.

SUMMARY

An embodiment that is described herein provides an Integrated Circuit (IC) including electronic circuitry, an electronic fuse (eFuse) and a protection circuit. The eFuse is configured to be selectably programmed to a logical state. The electronic circuitry is configured to read the eFuse and to operate in accordance with the logical state read from the eFuse. The eFuse has a first range of operational voltages, and the electronic circuitry has a second range of operational voltages that is broader than the first range of operational voltages. The protection circuit is configured to prevent the electronic circuitry from misreading the logical state of the eFuse due to a voltage supply to the IC falling within the second operational voltage range but outside the first operational voltage range.

In some embodiments, the protection circuit is configured to prevent the voltage supply from causing the electronic circuitry to operate in a non-secure mode even though the logical state of the eFuse specifies a secure mode.

In an embodiment, the protection circuit includes a plurality of reference eFuses that are pre-programmed to respective predefined logical states, the protection circuit configured to verify, during field operation of the IC, that actual logical states read from the reference eFuses match the respective predefined logical states.

In an example embodiment, the protection circuit includes one or more additional eFuses that are programmed to a same logical state as the eFuse, the protection circuit configured to verify that logical states read from the additional eFuses match the logical state of the eFuse.

In a disclosed embodiment, the protection circuit includes a voltage regulator configured to provide to the eFuse a regulated voltage that falls within the first operational voltage range, regardless of whether the voltage supply to the IC falls inside or outside the first operational voltage range.

In an embodiment, the eFuse is programmed to a target logical state selected from a first logical state and a second logical state, the first logical state being characterized by a first range of resistances of the eFuse, the second logical state being characterized by a second range of resistances of the eFuse, and the first and second ranges being separated by a margin, and the protection circuit includes circuitry configured to sense a post-programming resistance of the eFuse and, when the post-programming resistance falls in the margin between the first and second ranges, to revert to program another eFuse in the IC to the target logical state.

Typically, the first range of operational voltages and the second range of operational voltages at least partially overlap one another.

There is additionally provided, in accordance with an embodiment that is described herein, a method for securing an electronic fuse (eFuse) in an Integrated Circuit (IC). The method includes reading the eFuse and operating electronic circuitry in the IC in accordance with the logical state read from the eFuse. The eFuse has a first range of operational voltages, and the electronic circuitry has a second range of operational voltages that is broader than the first range of operational voltages. The electronic circuitry is prevented from misreading the logical state of the eFuse due to a voltage supply to the IC falling within the second operational voltage range but outside the first operational voltage range.

The present disclosure will be more fully understood from the following detailed description of the embodiments thereof, taken together with the drawings in which:

DETAILED DESCRIPTION OF EMBODIMENTS

Figure 1:
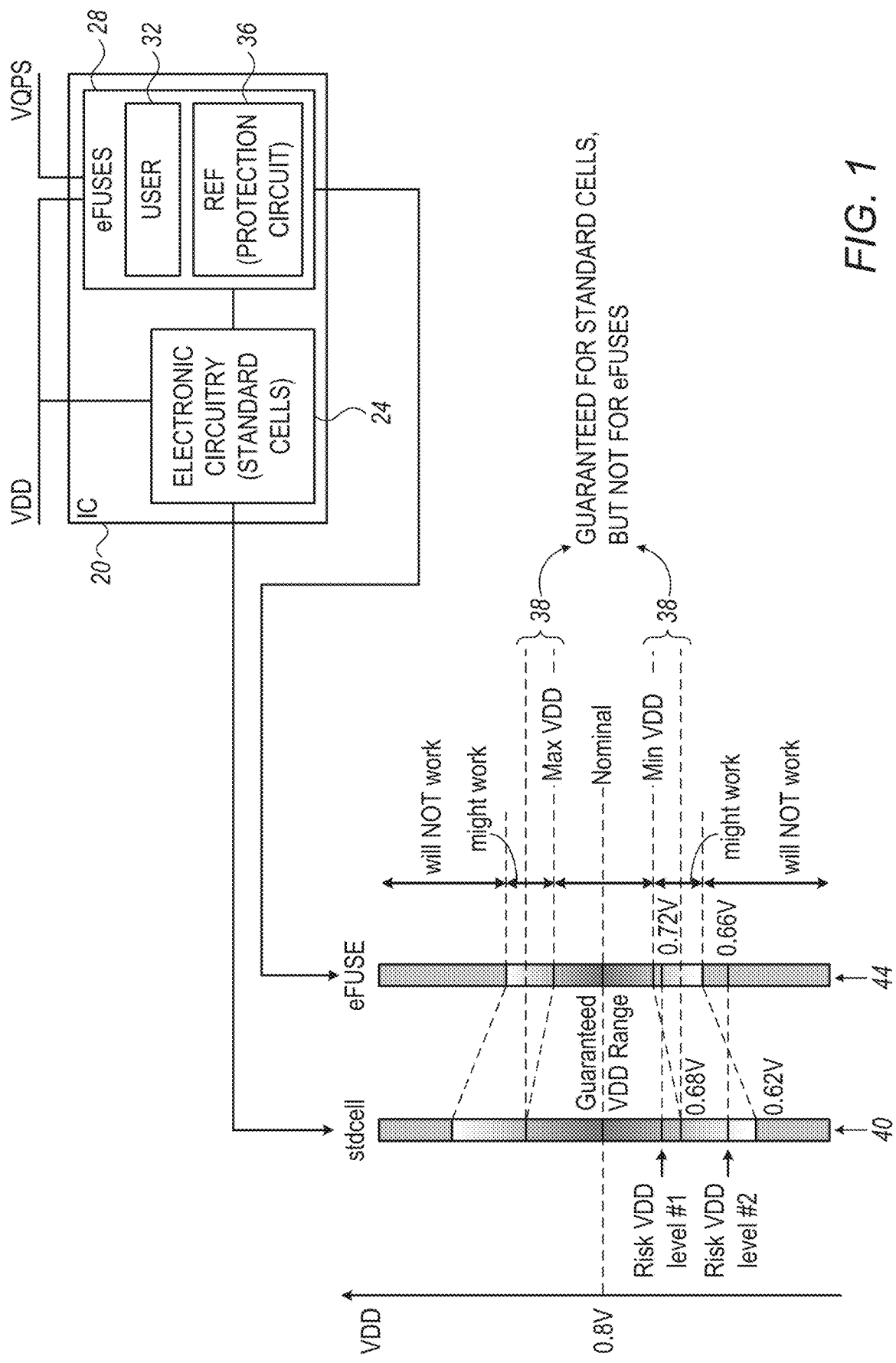
FIGS. 1-3 are block diagrams that schematically illustrate Integrated Circuits (ICs) comprising protection circuits that protect eFuses against abnormal supply voltages, in accordance with embodiments that are described herein.

Electronic fuses (eFuses) are commonly used for post-fabrication configuration of ICS. In some applications, e.g., in data-critical and mission-critical ICs, the programming of eFuses is required to be highly reliable. Failure to read the correct logical state of an eFuse may lead to misconfiguration, failure or abnormal functioning of the IC or of the IC's host system. In some scenarios such an event may have undesired consequences, e.g., a security breach or a safety hazard.

One potential failure mechanism is due to the fact that, in some process nodes, the guaranteed operational voltage range (the voltage range in which correct functionality is guaranteed) of eFuses is narrower than the guaranteed operational voltage range of standard cells used for implementing the IC's electronic circuitry. In other words, the guaranteed operational voltage range of the eFuses is contained within, but smaller than, the guaranteed operational voltage range of the IC's electronic circuitry. In such cases, some supply voltages (VDDs) fall within the (broader) operational voltage range of the electronic circuitry but outside the (narrower) operational voltage range of the eFuses.

When an IC is supplied with such a VDD value, the electronic circuitry of the IC is fully operational, but the eFuses may be unreliable. The electronic circuitry may therefore misread the logical state of an eFuse, potentially leading to unexpected functioning of the IC. One physical mechanism that causes such a failure in an eFuse is regrowth or reconnection of fused copper interconnects due to electromigration. An abnormal VDD may be set, for example, as part of an attack that attempts to extract information from the IC or otherwise operate the IC illegitimately.

Embodiments that are described herein provide circuits and methods for enhancing the reliability of programming and readout of eFuses. In some embodiments, the IC comprises a protection circuit configured to prevent the electronic circuitry from misreading an eFuse due to an abnormal supply voltage (a supply voltage that is within the operational voltage range of the electronic circuitry but outside the operational voltage range of the eFuses). The description that follows lists several non-limiting examples of protection circuits.

In one embodiment (see FIG. 1), the IC comprises a set of additional eFuses, referred to herein as "reference eFuses". The set of reference eFuses is pre-programmed to a respective set of predefined logical states that are known in advance and can be verified during readout. Pre-programming of the reference eFuses may be carried out, for example, during manufacturing or during chip probing. Later, during field operation of the IC, the electronic circuitry reads the reference eFuses and verifies that the actual logical states read from the reference eFuses matches the expected pre-programmed logical states. In this embodiment, the reference eFuses are regarded as a protection circuit.

In another embodiment (see FIG. 2), in addition to programming a certain eFuse to a desired logical state, one or more additional eFuses are programmed to the same logical state. During readout, the electronic circuitry verifies that the logical states read from the additional eFuses match the logical state of the eFuse read from the eFuse being protected. In this embodiment, the one or more additional eFuses are regarded as a protection circuit.

In yet another embodiment (see FIG. 3), the protection circuit comprises a voltage regulator that derives a regulated voltage for the eFuses from VDD. The regulated voltage is guaranteed to fall within the operational voltage range of the eFuses (and therefore correct readout of the eFuses is guaranteed) regardless of whether VDD (the voltage supply to the IC) falls inside or outside the eFuses' operational voltage range.

In still another embodiment (see FIG. 4), a certain range of eFuse post-programming resistances is defined as a valid range for a "0" logical state, and another range of eFuse post-programming resistances is defined as a valid range for a "1" logical state. In one demonstrative example, eFuses that are programmed properly to "0" are assumed to have a post-programming resistance above 1 MΩ, and eFuses that are programmed properly to "1" are assumed to have a post-programming resistance below 10Ω. eFuses having a post-programming resistance that falls in the margin between the two ranges (in the present example between 100 and 1 MΩ) are assumed to be programmed improperly.

In this embodiment, after programming an eFuse to a target logical state, the electronic circuitry senses the post-programming resistance of the eFuse. The electronic circuitry then verifies whether the post-programming resistance falls within a resistance range indicative of a legitimate logical state ("0" or "1"), or in the margin between the two legitimate resistance ranges. If the post-programming resistance falls in the margin between the legitimate resistance ranges, the electronic circuitry reverts to program another eFuse to the target logical state. In this embodiment, the circuitry that reads and verifies the post-programming resistance of the eFuse is regarded as a protection circuit.

The disclosed protection circuits and associated methods provide enhanced security against attacks that attempt exploiting the narrower operational voltage range of eFuses. For example, in an embodiment, the logical state of an eFuse specifies whether the IC operates in a secure mode or in a non-secure mode. By attacking the eFuse, an unauthorized party may attempt to illegitimately operate the IC in the non-secure mode. The disclosed techniques protect the IC from such attacks.

The disclosed techniques enable the use of eFuses in sensitive, data-critical or mission-critical applications, even though the eFuses operate reliably over a narrower voltage range in comparison with other circuitry.

FIG. 1 is a block diagram that schematically illustrates an Integrated Circuits (IC) 20 comprising an eFuse protection circuit, in accordance with an embodiment that is described herein.

IC 20 comprises electronic circuitry 24 that carries out the designated functionality of the IC. Electronic circuitry 24 may comprise, for example, a processor, a memory, logic circuitry and/or any other suitable type of circuitry. Electronic circuitry 24 is implemented using standard cells, i.e., cells drawn from a standard library of the applicable process node (such as may be provided by a Fab or adapted by an IC designer).

IC 20 further comprises a plurality of eFuses 28. One or more of eFuses 28 are referred to as "user eFuses" 32. User eFuses 32 are used for configuring the IC. An additional set of eFuses, referred to as "reference eFuses" 36, is used as a protection circuit for protecting user eFuses 32, as will be described below.

Both electronic circuitry 24 and eFuses 28 are supplied with a supply voltage denoted VDD. In some embodiments eFuses 28 are also connected to a voltage denoted VQPS, e.g., 1.8V or other suitable level.

The bottom-left of FIG. 1 shows operational voltage ranges of the standard cells (used for implementing electronic circuitry 24) and of eFuses 28, in an embodiment. A bar 40 shows the operational voltage range of the standard cells, and a bar 44 shows the operational voltage range of the eFuses. As seen, the nominal voltage level for both standard cells and eFuses is VDD=0.8V. The standard cells are guaranteed to be operational in the range VDD=0.8±0.12V. The eFuses, on the other hand, are only guaranteed to be operational in the narrower range VDD=0.8±0.08V.

Therefore, when the supply voltage is set to an abnormal level that is within the operational range of the standard cells but outside the operational range of the eFuses (e.g., 0.68V<VDD<0.72V, marked "Risk VDD level #1" in the figure), electronic circuitry 24 will be operational but eFuses 28 may be misread (i.e., read as "0" instead of "1" or vice versa). In the present example, a range 38 on either side of the nominal VDD level comprises the voltages that fall within the operational range of the standard cells but outside the operational range of the eFuses.

In some embodiments, an additional, broader voltage range is specified for both the standard cells and the eFuses. Outside this voltage range the circuitry will not operate. In the present example, the standard cells (and therefore circuitry 24) will not be operational for VDD<0.62V and for VDD>0.98V. Efuses 28, on the other hand, will not be operational for VDD<0.66V and for VDD>0.94V. Here, too, the operational voltage range of eFuses 28 is narrower than the operational voltage range of circuitry 24. If the supply voltage is set to an abnormal level that is within the operational range of the standard cells but outside the operational range of the eFuses (e.g., 0.62V<VDD<0.66V, marked "Risk VDD level #2" in the figure), electronic circuitry 24 will be operational but eFuses 28 may be misread.

In the example of FIG. 1, the various voltage ranges are symmetrical relative to the nominal voltage VDD=0.8V. The abnormal voltages ("Risk VDD level #1" and "Risk VDD level #2") are demonstrated on the lower side of the voltage ranges, by way of example. By the same token, an abnormal VDD level (e.g., a VDD level falling in ranges 38) can be set on the upper side of the voltage ranges.

In some embodiments, reference eFuses 36 are used for preventing erroneous readout of user eFuses 32 due to setting of an abnormal VDD level. Reference eFuses 36 are pre-programmed to respective predefined logical states that are known in advance and can be verified during readout. In one example, reference eFuses 36 comprise a set of thirty-two eFuses, each pre-programmed to a predefined logic state ("1" or "0"). The pre-programming may be performed, for example, during manufacturing or during chip probing.

During field operation of IC 20, while operating at a certain VDD, electronic circuitry 24 reads reference eFuses 36 and verifies that the actual logical states read from the reference eFuses matches the expected pre-programmed logical states. If so, the present VDD is regarded normal, and electronic circuitry 24 regards the logical states read from user eFuses 32 as valid. If not (if one or more of the actual logical states read from reference eFuses 36 differ from the expected pre-programmed logical states), the present VDD is regarded abnormal. In this event, electronic circuitry 24 disregards the readout from user eFuses 32. The electronic circuitry may also initiate a suitable responsive action, e.g., shut-down IC 20 or issue an alert.

In an example embodiment, the set of predefined logical states of reference eFuses 36 together form a secret identifier, e.g., an identity of a manufacturer of IC 20.

Figure 2:
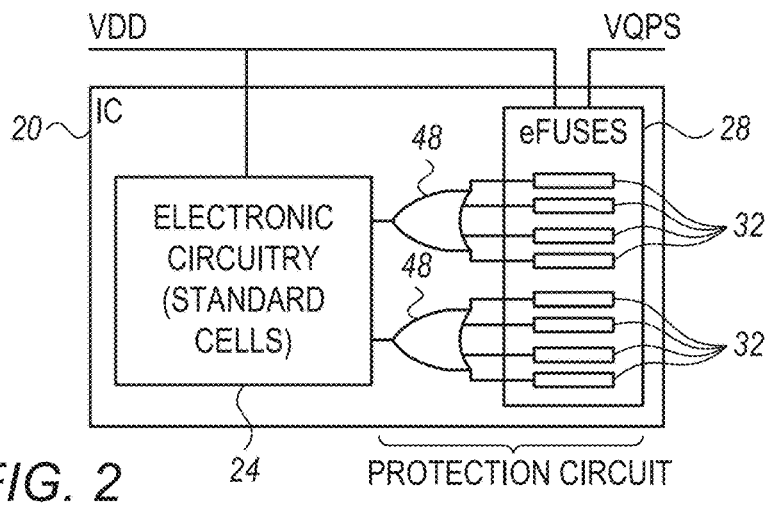

FIG. 2 is a block diagram that schematically illustrates another IC 20 comprising an eFuse protection circuit, in accordance with another embodiment that is described herein. The voltage ranges of electronic circuitry 24 and eFuses 28 are the same as in FIG. 1 above.

In the present embodiment, the assumption is that a faulty eFuse will be read as "0", regardless of the logical state it was programmed to. To protect against such a failure mechanism, user eFuses 32 are divided into groups, in the present example four eFuses per group. All the eFuses in a given group are programmed to the same logical State ("1" or "0"). In other words, in addition to programming a certain eFuse to a desired logical state, one or more additional eFuses 32 are programmed to the same logical state.

During readout, electronic circuitry 24 verifies that the logical states read from all the eFuses in the group (e.g., an eFuse being protected and the additional eFuses in the group) are all the same. If any two eFuses in the group differ in their logical states, the readout is considered invalid.

In an example embodiment, IC 20 comprises a respective OR gate 48 per each group. Due to statistical variations in the voltage response of the eFuses, the likelihood that the eFuses in the group will all fail and return a "0" logical state is negligible, even at abnormal VDD. The output of gate 48 is thus indicative of whether or not the logical states read from all the eFuses in the group are the same.

If the logical states read from all the eFuses in a group are the same, electronic circuitry 24 regards this logical state as valid. If not, electronic circuitry 24 regards the logical state as invalid, and may trigger a responsive action.

Figure 3:
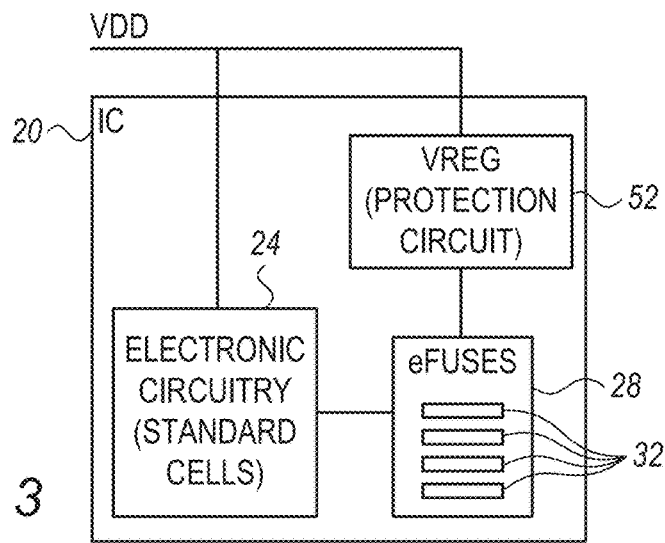

FIG. 3 is a block diagram that schematically illustrates another IC 20 comprising an eFuse protection circuit, in accordance with yet another embodiment that is described herein. In this embodiment, too, the voltage ranges of electronic circuitry 24 and eFuses 28 are the same as in FIG. 1 above.

In this embodiment, the protection circuit comprises a voltage regulator (VREG) 52 that derives a regulated voltage for eFuses 28 from VDD. The regulated voltage provided to eFuses 28 is guaranteed to fall within the operational voltage range of the eFuses, regardless of whether VDD falls inside or outside the eFuses' operational voltage range.

Figure 4:
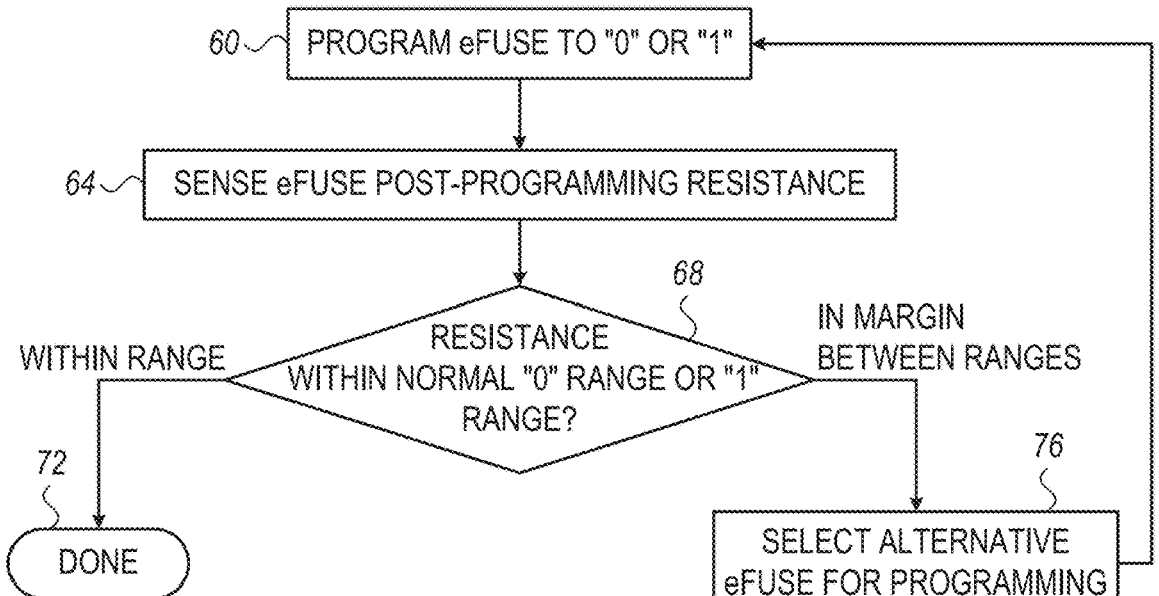
FIG. 4 is a flow chart that schematically illustrates a method for protecting an eFuse against an abnormal supply voltage, in accordance with an embodiment that is described herein.

FIG. 4 is a flow chart that schematically illustrates a method for protecting eFuses against an abnormal supply voltage, in accordance with an embodiment that is described herein. As in the previous examples, the voltage ranges of electronic circuitry 24 and eFuses 28 are the ranges seen in FIG. 1 above.

In the present example, eFuses that are programmed properly to one logical state (e.g., "0") are assumed to have a post-programming resistance that falls in a predefined range (e.g., R>1 MΩ). eFuses that are programmed properly to the other logical state (e.g., "1") are assumed to have a post-programming resistance that falls in a different predefined range (e.g., R<10Ω). eFuses having a post-programming resistance that falls in the margin between the two ranges (in the present example 10Ω<R<1 MΩ) are assumed to be programmed improperly.

The method begins with electronic circuitry 24 of IC 20 programming a certain eFuse 28 to a certain target logical state ("0" or "1"), at a programming operation 60. At a sensing operation 64, electronic circuitry 24 senses the post-programming resistance of the eFuse.

At a checking operation 68, electronic circuitry 24 checks whether the post-programming resistance falls within one of the resistance ranges that correspond to the logical states (in the present example below 10Ω or above 1 MΩ). If so, the method terminates at a completion operation 72. If not, i.e., if the post-programming resistance of the eFuse falls in the margin between the two legitimate resistance ranges, electronic circuitry 24 selects an alternative eFuse 28 for programming, at an alternative eFuse selection operation 76. The method then loops back to operation 60 above, in which electronic circuitry 24 programs the alternative eFuse. This process may be continued until an eFuse is programmed properly. If all available eFuses are exhausted, the electronic circuitry may issue a failure notification.

The configurations of IC 20, including the various protection circuits, as shown in FIGS. 1-3, are example configurations that are depicted solely for the sake of clarity. In alternative embodiments, any other suitable configurations can be used. For example, in some embodiments IC 20 may further comprise eFuse peripheral logic (not seen in the figures) used for data storage.

IC 20 may comprise, for example, an Application-Specific Integrated Circuit (ASIC) or Field-Programmable Gate Array (FPGA). In some embodiments, some functions of electronic circuitry 24 may be implemented in software and/or using a combination of hardware and software elements. Elements that are not mandatory for understanding of the disclosed techniques have been omitted from the figure for the sake of clarity.

In some embodiments, some functions of electronic circuitry 24 may be implemented in one or more programmable processors, e.g., one or more Central Processing Units (CPUs), microcontroller and/or Digital Signal Processors (DSPs), which are programmed in software to carry out the functions described herein. The software may be downloaded to any of the processors in electronic form, over a network, for example, or it may, alternatively or additionally, be provided and/or stored on non-transitory tangible media, such as magnetic, optical, or electronic memory.

Although the embodiments described herein mainly address reliable data storage, the methods and systems described herein can also be used in other applications, such as in wireless communication, automotive networks and other devices. Generally, the disclosed techniques can be used for reliably storing security information, system configuration and/or device dependent parameters for any electronic application.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC), comprising:
    an electronic fuse (eFuse), configured to be selectably programmed to a logical state;
    electronic circuitry, configured to read the eFuse and to operate in accordance with the logical state read from the eFuse,
    the eFuse having a first range of operational voltages, and the electronic circuitry having a second range of operational voltages that is broader than the first range of operational voltages; and
    wherein the IC further comprises a protection circuit, configured to prevent the electronic circuitry from misreading the logical state of the eFuse due to a voltage supply to the IC falling within the second operational voltage range but outside the first operational voltage range.

2. The IC according to claim 1, wherein the protection circuit is configured to prevent the voltage supply from causing the electronic circuitry to operate in a non-secure mode even though the logical state of the eFuse specifies a secure mode.

3. The IC according to claim 1, wherein the protection circuit comprises a plurality of reference eFuses that are pre-programmed to respective predefined logical states, the protection circuit configured to verify, during field operation of the IC, that actual logical states read from the reference eFuses match the respective predefined logical states.

4. The IC according to claim 1, wherein the protection circuit comprises one or more additional eFuses that are programmed to a same logical state as the eFuse, the protection circuit configured to verify that logical states read from the additional eFuses match the logical state of the eFuse.

5. The IC according to claim 1, wherein the protection circuit comprises a voltage regulator configured to provide to the eFuse a regulated voltage that falls within the first operational voltage range, regardless of whether the voltage supply to the IC falls inside or outside the first operational voltage range.

6. The IC according to claim 1, wherein the eFuse is programmed to a target logical state selected from a first logical state and a second logical state, the first logical state being characterized by a first range of resistances of the eFuse, the second logical state being characterized by a second range of resistances of the eFuse, and the first and second ranges being separated by a margin, and wherein the protection circuit comprises circuitry configured to sense a post-programming resistance of the eFuse and, when the post-programming resistance falls in the margin between the first and second ranges, to revert to program another eFuse in the IC to the target logical state.

7. The IC according to claim 1, wherein the first range of operational voltages and the second range of operational voltages at least partially overlap one another.

8. A method for securing an electronic fuse (eFuse) in an Integrated Circuit (IC), the method comprising:
    reading the eFuse and operating electronic circuitry in the IC in accordance with the logical state read from the eFuse, the eFuse having a first range of operational voltages, and the electronic circuitry having a second range of operational voltages that is broader than the first range of operational voltages; and
    preventing the electronic circuitry from misreading the logical state of the eFuse due to a voltage supply to the IC falling within the second operational voltage range but outside the first operational voltage range.

9. The method according to claim 8, wherein preventing the electronic circuitry from misreading the logical state of the eFuse comprises preventing the voltage supply from causing the electronic circuitry to operate in a non-secure mode even though the logical state of the eFuse specifies a secure mode.

10. The method according to claim 8, wherein preventing the electronic circuitry from misreading the logical state of the eFuse comprises reading, during field operation of the IC, a plurality of reference eFuses that are pre-programmed to respective predefined logical states, and verifying that actual logical states read from the reference eFuses match the respective predefined logical states.

11. The method according to claim 8, wherein preventing the electronic circuitry from misreading the logical state of the eFuse comprises reading one or more additional eFuses that are programmed to a same logical state as the eFuse, and verifying that the logical states read from the additional eFuses match the logical state of the eFuse.

12. The method according to claim 8, wherein preventing the electronic circuitry from misreading the logical state of the eFuse comprises providing to the eFuse a regulated voltage that falls within the first operational voltage range, regardless of whether the voltage supply to the IC falls inside or outside the first operational voltage range.

13. The method according to claim 8, wherein the eFuse is programmed to a target logical state selected from a first logical state and a second logical state, the first logical state being characterized by a first range of resistances of the eFuse, the second logical state being characterized by a second range of resistances of the eFuse, and the first and second ranges being separated by a margin, and wherein preventing the electronic circuitry from misreading the logical state of the eFuse comprises sensing a post-programming resistance of the eFuse and, when the post-programming resistance falls in the margin between the first and second ranges, reverting to program another eFuse in the IC to the target logical state.

14. The method according to claim 8, wherein the first range of operational voltages and the second range of operational voltages at least partially overlap one another.

\* \* \* \* \*